(12) United States Patent
Sutardja

(10) Patent No.: US 8,063,670 B2
(45) Date of Patent: Nov. 22, 2011

(54) HIGH VOLTAGE HIGH SIDE TRANSISTOR DRIVER

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 215 days.

(21) Appl. No.: 12/619,198

(22) Filed: Nov. 16, 2009

(65) Prior Publication Data

US 2010/0060327 A1 Mar. 11, 2010

Related U.S. Application Data

(63) Continuation of application No. 11/367,638, filed on Mar. 3, 2006, now Pat. No. 7,619,447.

(60) Provisional application No. 60/720,866, filed on Sep. 27, 2005, provisional application No. 60/762,738, filed on Jan. 27, 2006.

(51) Int. Cl.
*H03K 3/00* (2006.01)

(52) U.S. Cl. ........ 327/108; 327/109; 327/112; 315/307; 315/291; 315/360; 315/DIG. 7; 326/82

(58) Field of Classification Search .............. 315/209 R, 315/291, 307, 224, 247, 276, 282, 360, 362, 315/DIG. 4, DIG. 5, DIG. 7; 327/108, 109, 327/112, 427, 434; 326/82, 83, 27; 307/107, 307/126; 361/93.6
See application file for complete search history.

(56) References Cited

U.S. PATENT DOCUMENTS

| | | | |
|---|---|---|---|
| 5,272,398 A | 12/1993 | Schroder-Brumloop et al. | |
| 5,301,085 A | 4/1994 | Miettinen | |
| 5,309,066 A | 5/1994 | Ditlevsen | |
| 5,399,913 A | 3/1995 | Widener et al. | |
| 5,900,683 A | 5/1999 | Rinehart | |
| 6,222,325 B1 | 4/2001 | Wuidart et al. | |
| 6,728,088 B2 | 4/2004 | Aiello et al. | |
| 6,731,078 B2 | 5/2004 | Huber et al. | |
| 6,828,740 B2 | 12/2004 | Takahashi et al. | |
| 7,176,723 B2 | 2/2007 | Rozsypal | |
| 7,274,578 B2* | 9/2007 | Lecheler et al. | 363/71 |
| 7,405,595 B2 | 7/2008 | Yang et al. | |
| 2006/0238145 A1 | 10/2006 | Sutardja | |

FOREIGN PATENT DOCUMENTS

GB 2 249 227 A 4/1992

OTHER PUBLICATIONS

Communication from the European Patent Office dated Oct. 27, 2006 with the extended European Search Report for Application No. 06016937.2-1233; 9 pages.

* cited by examiner

*Primary Examiner* — Haiss Philogene

(57) ABSTRACT

A transistor driver includes a sender module configured to generate a power input signal. A converter module includes a transformer including a first side and a second side. The first side of the transformer is configured to receive the power input signal. A rectifier is connected to the second side of the transformer. The converter module is configured to generate an output signal at an output of the rectifier. A first receiver module is connected to each of the second side of the transformer and the output of the rectifier. The first receiver module is configured to transition a first transistor between an ON state and an OFF state based on a first signal received from the second side of the transformer.

18 Claims, 6 Drawing Sheets

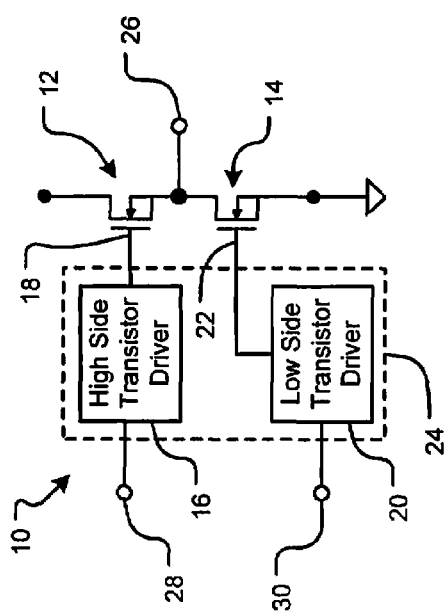
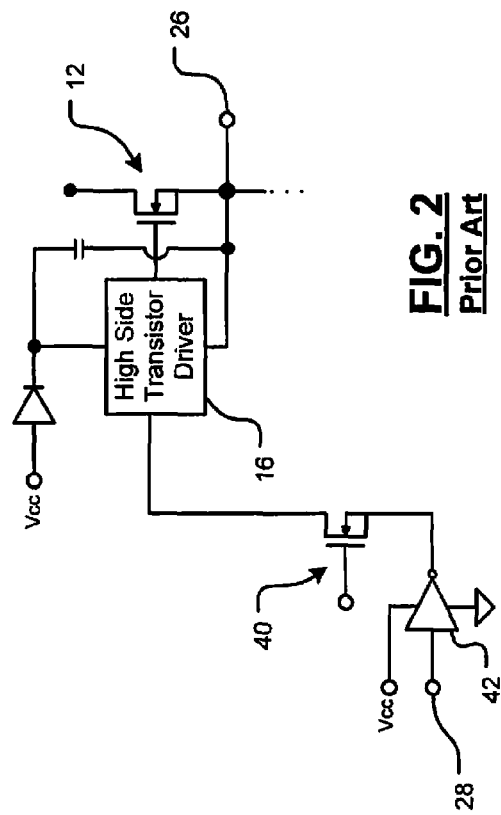

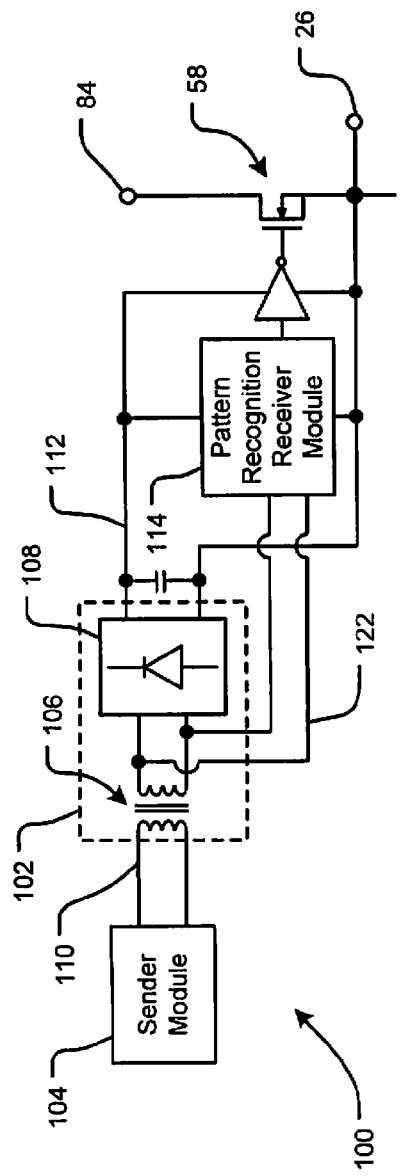
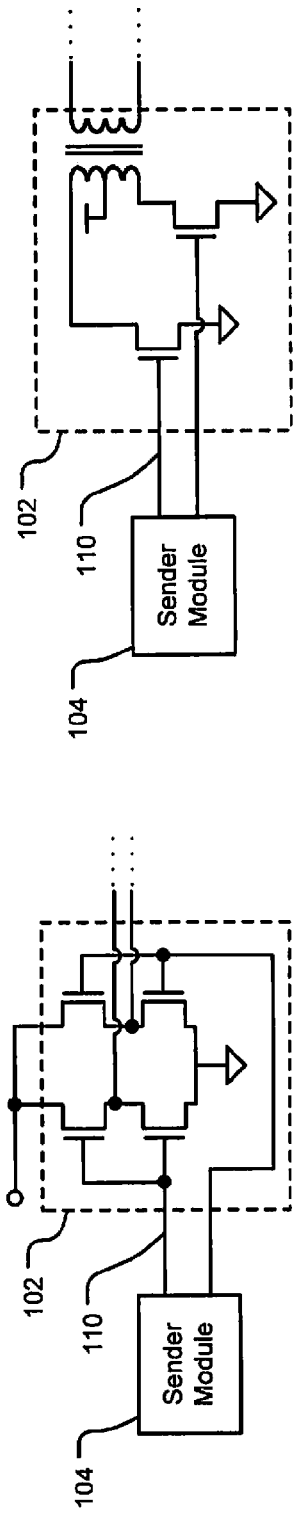
FIG. 4A
FIG. 4B
FIG. 4C

HIGH VOLTAGE HIGH SIDE TRANSISTOR DRIVER

CROSS-REFERENCE TO RELATED APPLICATIONS

This application is a continuation of U.S. patent application Ser. No. 11/367,638, filed Mar. 3, 2006, now U.S. Pat. No. 7,619,447 which claims the benefit of U.S. Provisional Application No. 60/720,866, filed Sep. 27, 2005 and U.S. Provisional Application No. 60/762,738, filed Jan. 27, 2006. The disclosures of the above applications are incorporated herein by reference in their entirety.

FIELD

The present disclosure relates to high-side transistor drivers, and more particularly to a high voltage, high-side transistor driver.

BACKGROUND

High side transistor drivers are used to drive a high side transistor that is connected to a positive supply and is floating (i.e., that is not ground-referenced). The transistor may be a MOSFET (metal oxide semiconductor field effect transistor) or an IGBT (insulated gate bipolar transistor). High side transistors may require a voltage translation from a level shifting device such as a high voltage level shifter. Floating transistors such as the high side transistors may be difficult to turn ON and OFF quickly.

Referring now to FIG. 1, an exemplary transistor driver circuit 10 is shown. The transistor driver circuit 10 includes a high side transistor 12 and a low side transistor 14. A high side transistor driver 16 is connected to a gate 18 of the high side transistor 12 and selectively turns the high side transistor 120N and OFF. A low side transistor driver 20 is connected to a gate 22 of the low side transistor 14 and selectively turns the low side transistor 140N and OFF. The high side transistor driver 16 and the low side transistor driver 20 may be integrated in a transistor driver module 24. For example, the drivers 16 and 20 turn the transistors 12 and 140N and OFF to vary current and/or voltage to an output node 26 according to input signals 28 and 30.

Referring now to FIG. 2, an exemplary arrangement of the high side transistor 12 and the high side transistor driver 16 is shown in more detail. The input signal 28 is input to the high side transistor driver 16 through a high voltage level shifter 40 and an inverter 42. For example, the high voltage level shifter 40 may include a high voltage transistor. Although only a single high voltage transistor is shown, additional high voltage transistors may be necessary to implement the high voltage level shifter 40. Typically, integration of multiple high voltage transistors with other low voltage transistors (not shown) on the same die may be difficult.

Further, for certain applications (e.g., such as fluorescent ballast drivers), voltage stress of more than 600 volts may be applied to the high voltage transistors. Circuitry of the high side transistor driver needs to be able to float above ground by a similar voltage level. As a result, specialty semiconductor processes, such as thick oxide SOI (silicon-on-insulator) processes, may be used. However, because of the large junction capacitances of high voltage transistors, the resulting circuit is typically quite slow. For example, some ballast drivers that implement the high side transistor driver 16 as described in FIG. 2 may operate at a maximum of 50 kHz.

SUMMARY

A high side transistor driver comprises A sender module that generates a power input signal. A converter module receives the power input signal and generates an output signal that has a higher voltage than the power input signal. A receiver module receives the output signal and the power input signal and transitions a transistor between ON and OFF states based on the output signal and the power input signal.

In other features of the invention, the converter module includes a transformer that receives the power input signal. The converter module includes a rectifier that communicates with the transformer and generates the output signal. The power input signal includes an embedded signal that indicates a desired state of the transistor. The receiver module detects the embedded signal and transitions the transistor based on the embedded signal. The power input signal has a first frequency and a second frequency that is lower than the first frequency, wherein the second frequency indicates the embedded signal.

In other features of the invention, the high side transistor driver comprises a second receiver module, wherein the receiver module is located on a high voltage side of the high side transistor driver and the second receiver module is located on a low voltage side of the high side transistor driver. The receiver module generates a status signal and the second receiver module receives the status signal. The status signal is indicative of at least one of a short circuit condition, an over temperature condition, and a polarity of a transformer in communication with the converter module.

In other features of the invention, an oscillator generates an oscillation signal. A digital state machine generates the power input signal in response to the oscillation signal. The high side transistor driver further comprises a digital interpolator.

In other features of the invention, a ballast for a fluorescent light comprises the high side transistor driver. The ballast provides current and/or voltage to the fluorescent light based on the state of the transistor. A ballast logic module includes the sender module. The converter module implements a DC/DC converter and the sender module synchronizes the DC/DC converter with the embedded signal. The power input signal includes phase encoding and power delivery components.

In other features of the invention, a high side transistor driver comprises a converter module including a transformer that receives a power input signal and generates an output signal that has a higher voltage than the power input signal. An input module includes a transformer that receives a driver input signal and generates a driver signal in response to the driver input signal, wherein the driver input signal includes pulses. A receiver module receives the output signal and the driver signal and transitions a transistor between ON and OFF states based on the output signal and the driver signal. A delay matching module adds a delay to a low side transistor, wherein the delay corresponds to a delay of the high side transistor driver. The sender module generates a time allocation signal that indicates when the second receiver module is operable to receive the status signal.

A high side transistor driver comprises sending means for generating a power input signal, converting means for receiving the power input signal and generating an output signal that has a higher voltage than the power input signal, and receiving means for receiving the output signal and the power input signal and for transitioning a transistor between ON and OFF states based on the output signal and the power input signal.

In other features of the invention, the converting means includes a transformer that receives the power input signal.

The converting means includes a rectifier that communicates with the transformer and generates the output signal. The power input signal includes an embedded signal that indicates a desired state of the transistor. The receiving means detects the embedded signal and transitions the transistor based on the embedded signal. The power input signal has a first frequency and a second frequency that is lower than the first frequency, wherein the second frequency indicates the embedded signal.

In other features of the invention, the high side transistor driver further comprises second receiving means for receiving a status signal, wherein the receiving means is located on a high voltage side of the high side transistor driver and the second receiving means is located on a low voltage side of the high side transistor driver. The receiving means generates the status signal. The status signal is indicative of at least one of a short circuit condition, an over temperature condition, and a polarity of a transformer in communication with the converting means.

In other features of the invention, the high side transistor driver further comprises oscillating means for generating an oscillation signal and digital state machine means for generating the power input signal in response to the oscillation signal. The high side transistor driver further comprises digital interpolating means for increasing an output frequency resolution.

In other features of the invention, a ballast for a fluorescent light comprises the high side transistor driver. The ballast provides current and/or voltage to the fluorescent light based on the state of the transistor. The converter module implements a DC/DC converter and the sending means synchronizes the DC/DC converter with the embedded signal. The power input signal includes phase encoding and power delivery components.

In other features of the invention, a high side transistor driver comprises converting means including a transformer for receiving a power input signal and generating an output signal that has a higher voltage than the power input signal, input means including a transformer for receiving a driver input signal and generating a driver signal in response to the driver input signal, wherein the driver input signal includes pulses, and receiving means for receiving the output signal and the driver signal and for transitioning a transistor between ON and OFF states based on the output signal and the driver signal. The high side transistor driver further comprises delay matching means for adding a delay to a low side transistor, wherein the delay corresponds to a delay of the high side transistor driver. The sending means generates a time allocation signal that indicates when the second receiving means is operable to receive the status signal.

A method for driving a high side transistor in a circuit comprises generating a power input signal, receiving the power input signal and generating an output signal that has a higher voltage than the power input signal at a first module, receiving the output signal and the power input signal at a second module, and transitioning a transistor between ON and OFF states based on the output signal and the power input signal.

In other features of the invention, the step of receiving the power input signal at the first module includes receiving the power input signal at a transformer. The power input signal is rectified at the first module. The power input signal includes an embedded signal that indicates a desired state of the transistor. The embedded signal is detected and the transistor is transitioned based on the embedded signal. The power input signal has a first frequency and a second frequency that is lower than the first frequency, wherein the second frequency indicates the embedded signal.

In other features of the invention, a status signal is generated at the second module. The status signal is received at a third module. The second module is located on a high voltage side of the circuit and the third module is located on a low voltage side of the circuit. The status signal is indicative of at least one of a short circuit condition, an over temperature condition, and a polarity of a transformer in communication with the first module.

In other features of the invention, an oscillation signal is generated. The power input signal is generated at a digital state machine in response to the oscillation signal. Current and/or voltage is provided to a fluorescent light based on the state of the transistor. The first module includes a DC/DC converter and the DC/DC converter is synchronized with the embedded signal. The method further comprises adding a delay to a low side transistor, wherein the delay corresponds to a delay of the high side transistor. The method further comprises generating a time allocation signal that indicates when the third module is operable to receive the status signal.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a schematic of a transistor driver circuit according to the prior art;

FIG. 2 is a schematic of a high side transistor driver including a high voltage level shifter according to the prior art;

FIG. 4A is a functional block diagram of a high side transistor driver including embedded signaling according to the present invention;

FIG. 4B is a circuit schematic of a converter module that includes an H bridge driver according to the present invention;

FIG. 4C is a circuit schematic of a converter module that includes a center tap push pull driver according to the present invention;

DETAILED DESCRIPTION

Figure 3:
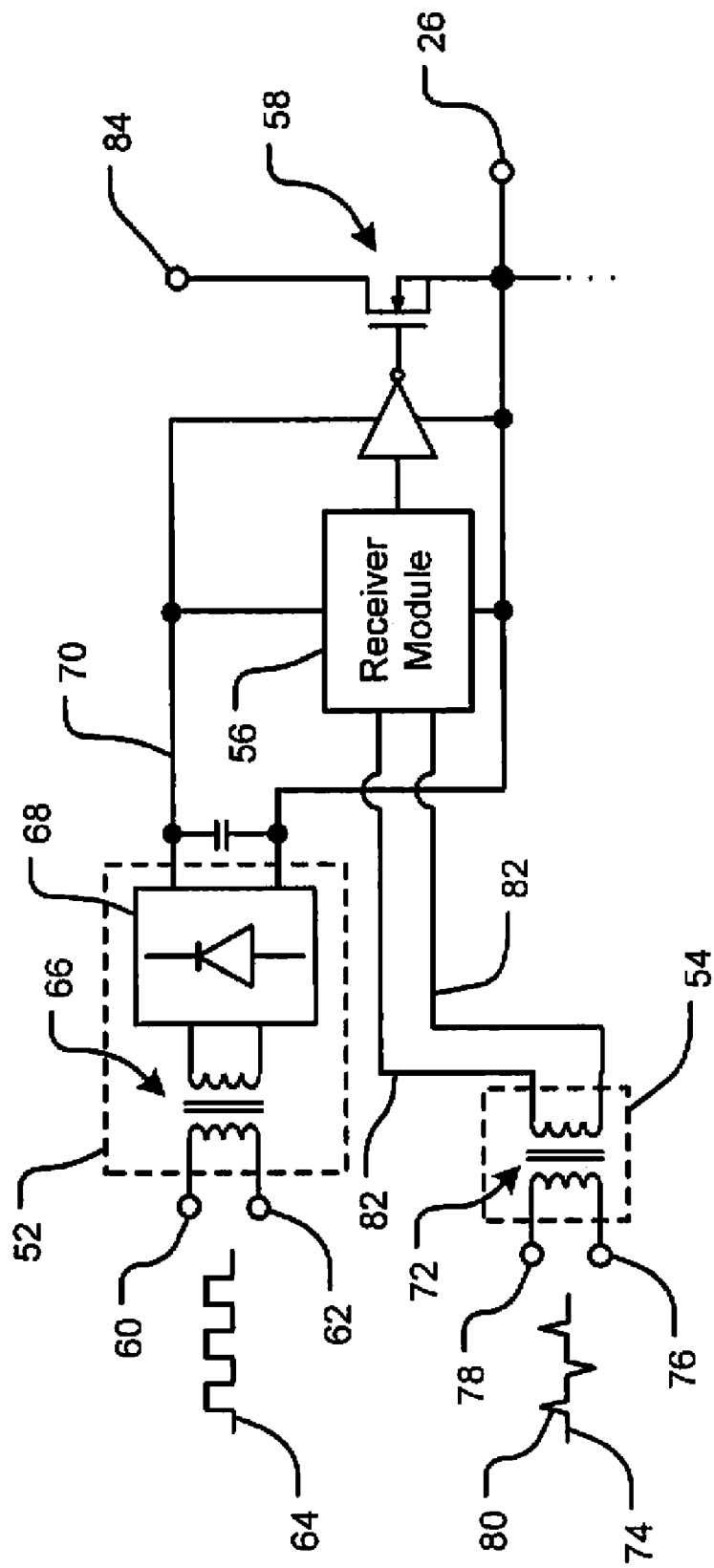
FIG. 3 is a functional block diagram of a high side transistor driver according to the present invention.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

The high side transistor driver of the present invention includes a transformer and eliminates the high voltage transistor/transistors used in the high voltage level shifter as described in FIG. 2. The transformer implements high frequency power delivery and, in certain implementations, embedded signaling.

Referring now to FIG. 3, a high side transistor circuit 50 includes a converter module 52, an input signal module 54, a receiver module 56, and a high side transistor 58. The converter module 54 receives a power input signal at power input nodes 60 and 62. For example, the power input signal may be a square wave signal as indicated at 64, although other input signals may be used. The converter module 54 may include a transformer 66 and a rectifier 68. The converter module 54 converts the power input signal to a DC output signal 70 that is output to the receiver module 56. The converter module 52 implements a high frequency, push-pull DC/DC converter that delivers power from a low side (i.e. the power input signal 64) to a high side (i.e. the DC output signal 70). For example, the transformer 66 may be sufficiently small to reduce manufacturing costs and space requirements. As such, the transformer 66 may require higher frequency operation. The transformer 66 isolates the DC output signal 70 from the power input signal 64.

The input signal module 54 includes a transformer 72 and receives a driver input signal 74 at input nodes 76 and 78. The driver input signal 74 may include input pulses (as indicated at 80) or other input signals that tend to avoid saturating a core of the transformer 72. The input signal module 54 outputs a driver signal 82 to the receiver module 56. The receiver module 56 receives and processes the driver signal 82 and converts the input pulses 80 to a high or low signal suitable for driving the high side transistor 58. The converter module 52 provides the energy required to drive the high side transistor 58 and the input signal module 54 determines the ON or OFF state of the high side transistor 58. The high side transistor 58 receives a high voltage, such as 600 volts, from a high voltage node 84. When the high side transistor 58 is ON, an output node 62 receives the high voltage from the high voltage node 84 through the high side transistor 58.

Referring now to FIG. 4A, a high side transistor circuit 100 that includes embedded signaling is shown. The high side transistor circuit 100 includes a converter module 102 and a sender module 104. The converter module 102 includes a transformer 106 and a rectifier 108. The converter module 102 converts a power input signal 110 to a DC output signal 112. A decoding device such as a pattern recognition receiver module 114 receives the DC output signal 112. The pattern recognition receiver module 114 uses the energy from the DC output signal 112 to drive the high side transistor 58.

Referring now to FIGS. 4B and 4C, the converter module 102 may include alternative circuit arrangements. For example, the converter module 102 may implement an H bridge driver arrangement as shown in FIG. 4B. The converter module 102 may implement a center tap push pull driver as shown in FIG. 4C.

Figure 5:
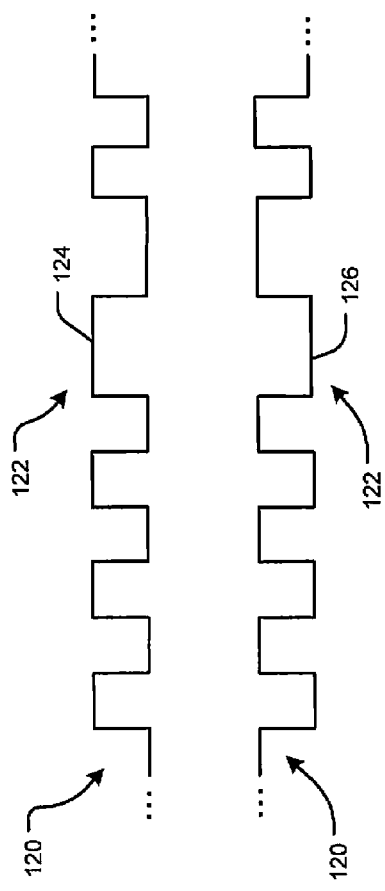
FIG. 5 illustrates a power input signal including embedded signaling according to the present invention.

Referring now to FIGS. 4A and 5, the sender module 104 outputs the power input signal 110. The power input signal 110 may be a square wave signal as indicated at 120. The power input signal 110 further includes an embedded signal 122 that determines the ON or OFF status of the high side transistor 58. For example, the embedded signal 122 may be a disturbance pattern (i.e. high and/or low pulses having a longer period/lower frequency) that interrupts a normal pattern of the power input signal 110.

The pattern recognition receiver module 114 receives the embedded signal 122 (via the power input signal 110) and controls the ON or OFF status of the high side transistor 58 accordingly. The pattern recognition receiver module 114 includes circuitry that detects changes in the pattern of the power input signal 110. For example, the embedded signal 122 may trigger the pattern recognition receiver module 114 to transition the high side transistor 58 from OFF to ON or from ON to OFF.

The embedded signal 122 may be square wave that starts low and transitions high as indicated at 124. Alternatively, the embedded signal 122 may be a square wave that starts high and transitions low as indicated at 126. In either case, the embedded signal 122 has no DC value to avoid saturating the transformer 106. In other words, the embedded signal 122 does not adversely affect the converter module 102 as long as the pulses have equal amplitudes and the embedded signal 122 does not saturate the transformer 106. When the period of the embedded signal 122 is below a threshold (e.g., less than three to four times a clock period of the converter module 102), the core of the transformer 106 will not be saturated.

Although the embedded signal 122 as described in FIGS. 4 and 5 demonstrates only two signal disturbance patterns, other signal disturbance patterns are possible. For example, the sender module 104 may embed a power on sequencing signal into the power input signal 110. In one implementation, the power on sequencing signal may direct the pattern recognition receiver module 114 and/or other components of the high side to begin normal operation. In another implementation, the sender module 104 may embed a shutdown signal into the power input signal 110 that directs the high side transistor 58 to shut down.

Figure 6:
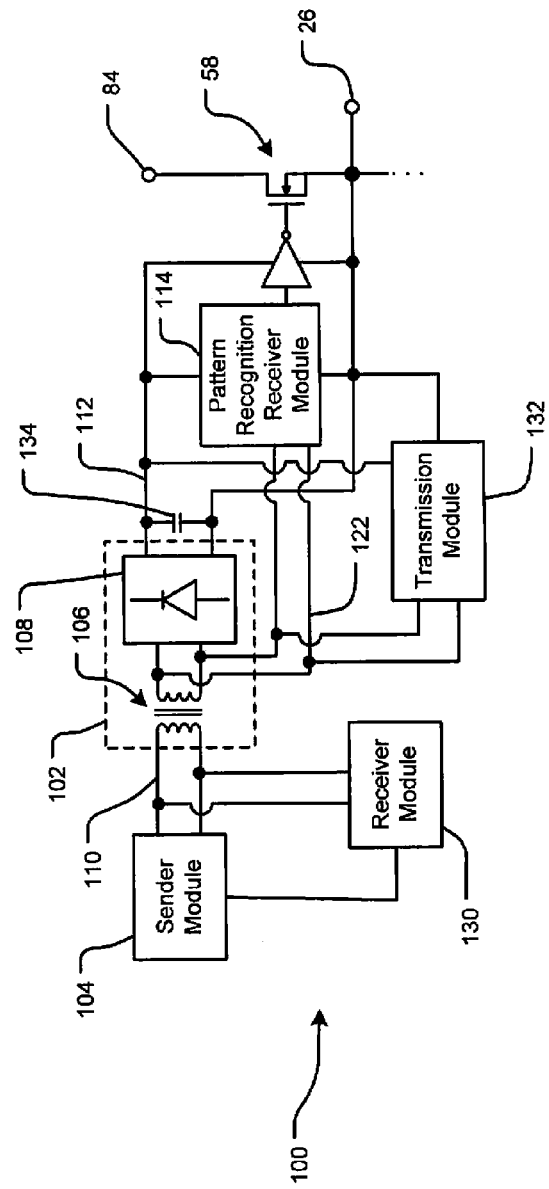
FIG. 6 is a functional block diagram of a high side transistor driver including reverse signaling according to the present invention.

Referring now to FIG. 6, the high side transistor circuit 100 may implement reverse signaling (i.e. bi-directional communication) and includes tri-stating the converter module 102 and/or the sender module 104. For example, the high side transistor circuit 100 may include a receiver module 130 that is located on the low side of the circuit and a transmission module 132. The receiver module 130 communicates with the transmission module 132 and the sender module 104. The transmission module 132 communicates with the pattern recognition receiver module.

The pattern recognition receiver module 114 may include circuitry (not shown) for detecting various statuses of the high side of the high side transistor circuit 100. For example, the pattern recognition receiver module 114 may detect statuses including, but not limited to, short circuit and over temperature conditions. Further, the pattern recognition receiver module may automatically detect polarity of a winding of the transformer 106. Alternatively, polarity of the winding may be detected by sensing change in high side current during a polarity detection search.

The converter module 102 may be temporarily disabled (e.g., tri-stated) to allow bi-directional communication (i.e. to allow the transmission module 132 to transmit data). Conversely, the transmission module 132 is tri-stated during normal operation. The transmission module 132 communicates status information that is indicative of the detected conditions to the receiver module 130. The transmission module 132 uses energy stored in a capacitor 134 to operate and communicate the status information. In another implementation, the receiver module 130 may be integrated with the sender module 104 and/or the transmission module 132 may be integrated with the pattern recognition receiver module 114.

The sender module 104 may generate a time allocation signal to inform the transmission module 132. For example, the sender module 104 determines time allocation slots for the transmission module 132 to transmit. The transmission module 132 receives the time allocation signal and transmits the communication information in a time allocation slot (e.g. a time slot of 3 milliseconds following the time allocation signal).

Figure 7:
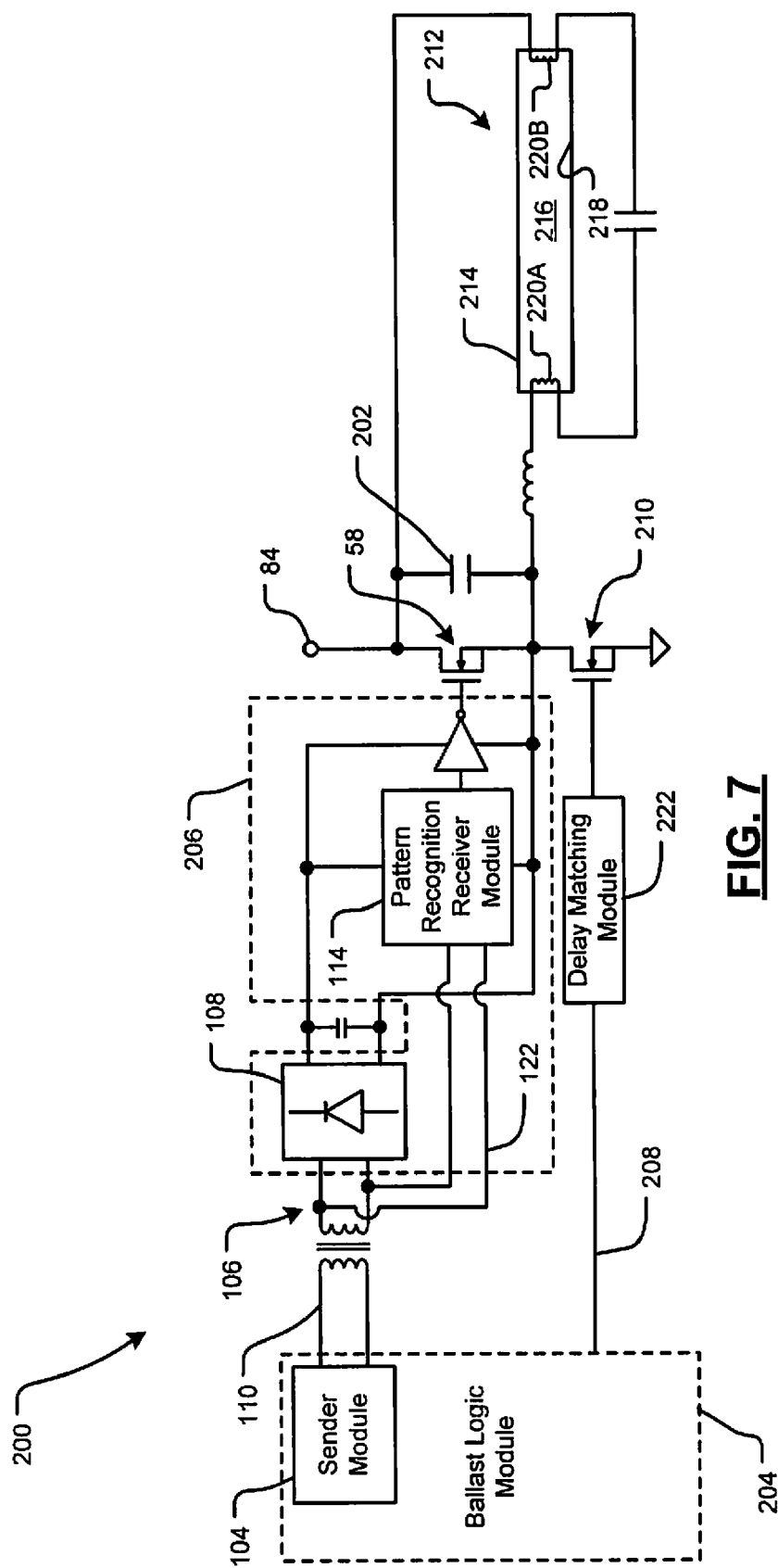
FIG. 7 is a functional block diagram of a fluorescent ballast that includes a high side transistor driver according to the present invention.

Referring now to FIG. 7, a ballast 200 for a fluorescent lamp may implement the present invention. The ballast 200 includes the transformer 106, a full or half-wave rectifier 108, an electrolytic capacitor 202, a ballast logic module 204, and the pattern recognition receiver module 114. For example, the electrolytic capacitor 202 may be used to filter or smooth voltage. The ballast logic module 204 includes the sender module 104. The rectifier 108 and the pattern recognition receiver module 114 may be implemented by an integrated circuit (IC) 206. For example, the pattern recognition receiver module 114 may share input pins of the rectifier 108.

The sender module 104 generates the input power signal 110 for driving the high side transistor 58 as described in FIGS. 4 and 6. The ballast logic module 204 generates a low side transistor input signal 208 for driving a low side transistor 210. The ballast logic module 204 switches the transistors 58 and 2100N and OFF to vary current and/or voltage to a fluorescent light 212 during startup and/or operation.

The fluorescent light 212 includes a sealed glass tube 214 that contains a first material such as mercury and a first inert gas such as argon, which are both generally identified at 216. The tube 214 is pressurized. Phosphor powder 218 may be coated along an inner surface of the tube 214. The tube 214 includes electrodes 220A and 220B (referred to collectively as electrodes 220) that are located at opposite ends of the tube 214. Power is supplied to the electrodes 220 according to the ON or OFF statuses of the transistors 58 and 210.

When power is supplied power to the electrodes 220, electrons migrate through the gas 216 from one end of the tube 214 to the opposite end. Energy from the flowing electrons changes some of the mercury from a liquid to a gas. As electrons and charged atoms move through the tube 214, some will collide with the gaseous mercury atoms. The collisions excite the atoms and cause electrons to move to a higher state. As the electrons return to a lower energy level they release photons or light. Electrons in mercury atoms release light photons in the ultraviolet wavelength range. The phosphor coating 218 absorbs the ultraviolet photons, which causes electrons in the phosphor coating 218 to jump to a higher level. When the electrons return to a lower energy level, they release photons having a wavelength corresponding to white light.

Current is output through both electrodes 220 during starting. The current flow creates a charge difference between the two electrodes 220. When the fluorescent light 212 is turned on, both electrode filaments heat up very quickly. Electrons are emitted, which ionizes the gas 216 in the tube 214. Once the gas is ionized, the voltage difference between the electrodes 220 establishes an electrical arc. The flowing charged particles excite the mercury atoms, which triggers the illumination process. As more electrons and ions flow through a particular area, they bump into more atoms, which frees up electrons and creates more charged particles. Resistance decreases and current increases. The ballast logic module 204 regulates power both during and after startup. An exemplary fluorescent light and ballast that may implement the ballast logic module 204 is described in further detail in U.S. patent application Ser. No. 11/112,808, filed on Apr. 22, 2005, which is hereby incorporated by reference in its entirety.

The ballast 200 may include a delay matching module 222. For example, the operation of the transistor may be delayed during the processing of input power signal 110. For example, there may be a delay between an output of the sender module 104 and a response of the transistor 58. The delay matching module 222 adds the delay to the transistor 210. In other words, the delay matching module 222 offsets the response of the transistor 210 to compensate for the delay. The ballast 200 may include a calibration circuit to adjust the delay dynamically. For example, the ballast logic module 204, sender module 104, or other components of the ballast 200 may determine the delay and adjust the delay matching module 222 accordingly.

Figure 8B:
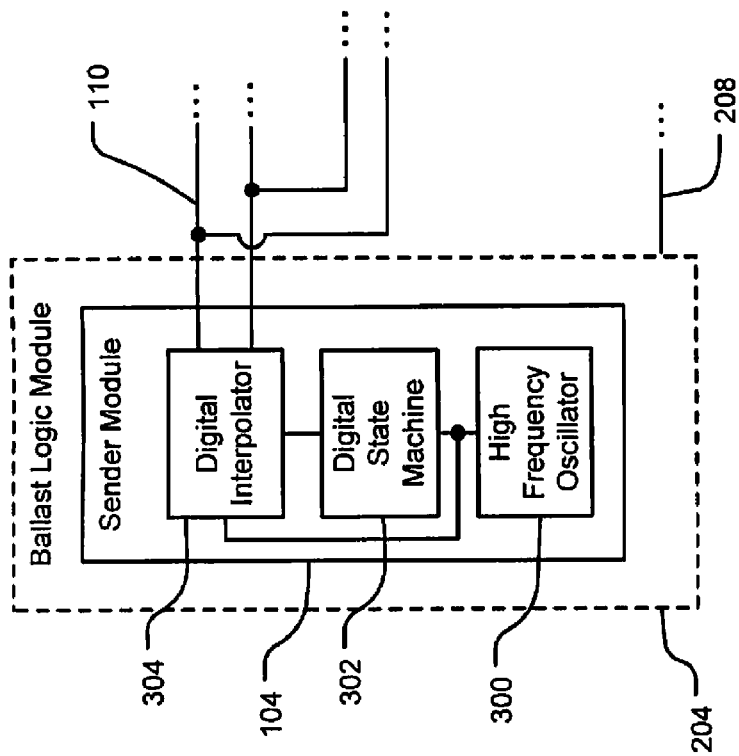
FIG. 8B is a functional block diagram of a second implementation of the ballast logic module according to the present invention.
Figure 8A:
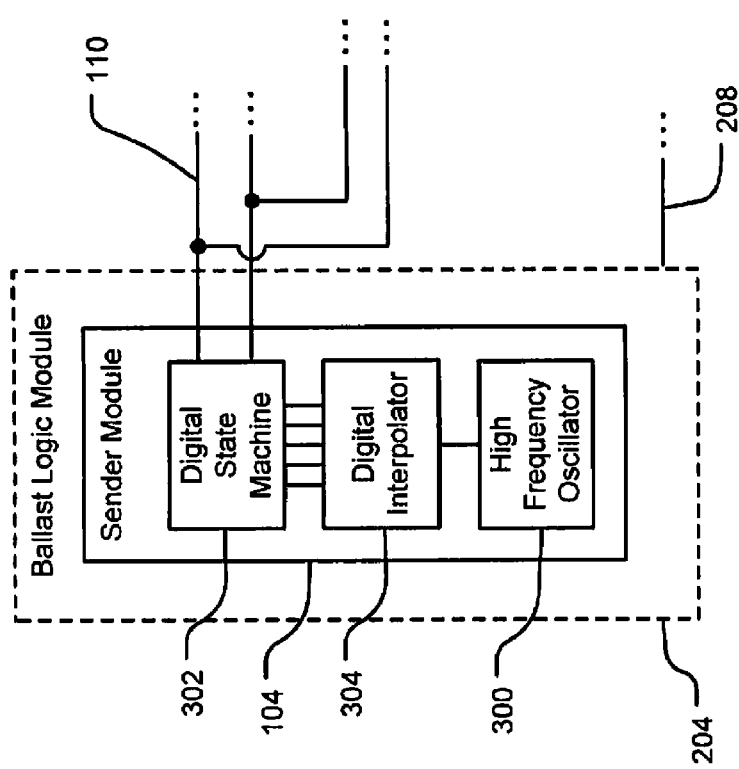
FIG. 8A is a functional block diagram of a ballast logic module according to the present invention.

Referring now to FIG. 8A, an exemplary ballast logic module 204 according to the present invention is shown in more detail. The ballast logic module 204 includes a high frequency oscillator 300 and a digital state machine 302. For example, the sender module 104 includes the high frequency oscillator 300 and the digital state machine 302. The digital stage machine 302 generates the power input signal 110. In other words, the digital state machine 302 outputs the power input signal 110 at an output frequency according to the oscillator 300. The ballast logic module changes the output frequency by changing a counter value of the digital state machine 302. To increase output frequency resolution, the ballast logic module 204 may further include a digital interpolator 304. In this manner, the ballast logic module 204 may implement a more complex frequency scanning algorithm in the digital domain. Further, the ballast logic module 204 may implement spread-spectrum technology by dithering the counter value of the digital state machine 302 around a final average target oscillator frequency. An alternative implementation of the ballast logic module 204 is shown in FIG. 8B.

As described in FIGS. 8A and 8B, the ballast logic module 204 operates in the digital domain to generate the disturbance pattern in the power input signal 110. In the digital domain, the ballast logic module 204 may generate the disturbance pattern in anticipation of certain events. For example, the ballast logic module 204 may generate a square wave disturbance signal slightly early to avoid generating extremely narrow pulses at a boundary of the normal pulses and the lower frequency (i.e. disturbance) pulses. The ballast logic module 204 is able to accurately adjust the lower frequency pulses so that pulse edges are precisely located. In other words, the normal pulses can resume immediately after the disturbance pulses. Further, a clock signal of the converter module 102 may be derived from the digital state machine 302. In this manner, the ballast logic module 204 can synchronize pulses of the converter module 102 with the disturbance pulses.

The ballast module 204 may include one or more status modules 310. For example, the status module 310 may implement an algorithm that detects lamp end of life based on lamp ignition retries. In this manner, the ballast logic module 204 can avoid damage due to overheating. Additionally, the status module 310 may implement over-voltage lamp detection by scanning startup voltage.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A transistor driver comprising:
a sender module configured to generate a power input signal,
a converter module comprising
a transformer including a first side and a second side, the first side of the transformer being configured to receive the power input signal; and
a rectifier connected to the second side of the transformer, wherein the converter module is configured to generate an output signal at an output of the rectifier; and
a first receiver module connected to each of the second side of the transformer and the output of the rectifier, the first receiver module configured to transition a first transistor between an ON state and an OFF state based on a first signal received from the second side of the transformer.

2. The transistor driver of claim 1, further comprising a capacitor connected across the output of the rectifier.

3. The transistor driver of claim 1, wherein:
the first receiver module is configured to generate and output a status signal to the second side of the transformer, and
the transistor driver further comprises a second receiver module connected to the first side of the transformer, the second receiver module being configured to receive the status signal.

4. The transistor driver of claim 3, wherein the second receiver module is configured to adjust operation of the sender module based on the status signal.

5. The transistor driver of claim 1, wherein:
the sender module embeds an embedded signal in the power input signal, and
the embedded signal indicates a desired one of the ON state and the OFF state of the first transistor.

6. The transistor driver of claim 5, wherein the first receiver module is configured to:
detect the embedded signal; and
transition the first transistor between the ON state and the OFF state based on the embedded signal.

7. The transistor driver of claim 1, wherein:
the sender module is configured to switch the power input signal between a first frequency and a second frequency, the second frequency being lower than the first frequency, and
the first frequency corresponds to one of the ON and OFF states, and the second frequency corresponds to the other of the ON and OFF states.

8. The transistor driver of claim 3, wherein the status signal is indicative of at least one of a short circuit condition, an over temperature condition, and a polarity of a transformer in communication with the converter module.

9. A ballast for a fluorescent light, the ballast comprising:
the transistor driver of claim 1;
the first transistor, wherein the first transistor is configured to communicate with the fluorescent light;
a second transistor configured to communicate with one terminal of the first transistor; and
a ballast module comprising the sender module.

10. The ballast of claim 9, further comprising a delay matching module configured to add a delay to a control signal that is output by the ballast module to a control terminal of the second transistor, wherein the delay corresponds to a control delay at least one of the sender module and the first receiver module.

11. A transistor driver comprising:
a sender module configured to generate a power input signal, wherein the power input signal includes an embedded signal that indicates a desired state of a transistor, the desired state being an ON state or an OFF state;
a converter module comprising
a transformer including a first side and a second side, the first side configured to receive the power input signal; and
a rectifier connected to the second side of the transformer,
wherein the converter module is configured to receive the power input signal at the first side and to generate an output signal at an output of the rectifier; and
a first receiver module connected to each of the second side of the transformer and to the output of the rectifier, the first receiver module configured to transition a transistor between the ON state and the OFF state based on the embedded signal.

12. The transistor driver of claim 11, further comprising a capacitor connected across the output of the rectifier.

13. The transistor driver of claim 11, wherein:
the first receiver module is configured to generate and output a status signal to the second side of the transformer, and
the transistor driver further comprising a second receiver module connected to the first side of the transformer and is configured to receive the status signal.

14. The transistor driver of claim 13, wherein the second receiver module is configured to adjust operation of the sender module based on the status signal.

15. The transistor driver of claim 11, wherein:
the sender module is configured to generate the embedded signal by switching the power input signal between a first frequency and a second frequency, the second frequency being lower than the first frequency, and
the first frequency corresponds to one of the ON state and the OFF state and the second frequency corresponds to the other of the ON state and the OFF state.

16. The transistor driver of claim 13, wherein the status signal is indicative of at least one of a short circuit condition, an over temperature condition, and a polarity of a transformer in communication with the converter module.

17. A ballast for a fluorescent light comprising:
the transistor driver of claim 11;
the first transistor, wherein the first transistor is configured to communicate with the fluorescent light;
a second transistor configured to communicate with one terminal of the first transistor; and
a ballast module comprising the sender module.

18. The ballast of claim 17, further comprising a delay matching module configured to add a delay to a control signal that is output by the ballast module to a control terminal of the second transistor, wherein the delay corresponds to a control delay of at least one of the sender module and the first receiver module.

* * * * *